US012782820B2

(12) United States Patent
Park et al.

(10) Patent No.: US 12,782,820 B2
(45) **Date of Patent: *Nov. 3, 2026**

(54) STRIPPER COMPOSITION FOR REMOVING PHOTORESIST AND STRIPPING METHOD OF PHOTORESIST USING THE SAME

(71) Applicant: LG CHEM, LTD., Seoul (KR)

(72) Inventors: Tae Moon Park, Daejeon (KR); Dong Hoon Lee, Daejeon (KR); Hyun Woo Song, Daejeon (KR); Woo Ram Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 770 days.

This patent is subject to a terminal disclaimer.

(21) Appl. No.: 17/801,479

(22) PCT Filed: Sep. 17, 2021

(86) PCT No.: PCT/KR2021/012859

§ 371 (c)(1),
(2) Date: Aug. 22, 2022

(87) PCT Pub. No.: WO2022/065842

PCT Pub. Date: Mar. 31, 2022

(65) Prior Publication Data

US 2023/0091893 A1 Mar. 23, 2023

(30) Foreign Application Priority Data

Sep. 22, 2020 (KR) ........................ 10-2020-0122249
Sep. 17, 2021 (KR) ........................ 10-2021-0124895

(51) Int. Cl.
*G03F 7/42* (2006.01)

(52) U.S. Cl.
CPC ................ *G03F 7/425* (2013.01); *G03F 7/42* (2013.01); *G03F 7/422* (2013.01)

(58) Field of Classification Search
CPC .................................. G03F 7/42; G03F 7/425
See application file for complete search history.

(56) References Cited

U.S. PATENT DOCUMENTS

| | | | | |
|---|---|---|---|---|
| 5,795,702 A * | 8/1998 | Tanabe | G03F 7/425 510/176 |
| 9,983,481 B2 * | 5/2018 | Park | G03F 7/425 |
| 2003/0130149 A1 | 7/2003 | Zhou et al. | |
| 2005/0250660 A1 * | 11/2005 | Takashima | C11D 3/042 510/176 |
| 2008/0287333 A1 | 11/2008 | Inaoka | |
| 2012/0181248 A1 * | 7/2012 | Park | G03F 7/425 216/13 |
| 2014/0142017 A1 | 5/2014 | Peters et al. | |
| 2017/0081622 A1 | 3/2017 | Inaoka | |
| 2017/0115573 A1 * | 4/2017 | Park | C11D 3/0073 |

FOREIGN PATENT DOCUMENTS

| | | | |
|---|---|---|---|
| CN | 101866118 | A | 10/2010 |
| CN | 104122763 | A | 10/2014 |
| CN | 105723284 | A | 6/2016 |
| CN | 106547178 | A | 3/2017 |
| CN | 107346095 | A | 11/2017 |
| JP | 2007-511784 | A | 5/2007 |
| JP | 5885041 | B1 | 3/2016 |
| JP | 6684998 | B1 | 4/2020 |
| KR | 10-1434284 | B1 | 8/2014 |
| KR | 10-2014-0110383 | A | 9/2014 |
| KR | 10-2015-0087096 | A | 7/2015 |
| KR | 10-2016-0022837 | A | 3/2016 |
| KR | 10-2016-0033023 | A | 3/2016 |
| KR | 10-2017-0006988 | A | 1/2017 |
| KR | 10-1700631 | B1 | 1/2017 |
| KR | 10-2017-0099525 | A | 9/2017 |
| KR | 10-2018-0035590 | A | 4/2018 |
| WO | 2006-129538 | A1 | 12/2006 |

OTHER PUBLICATIONS

International Search Report & Written Opinion dated Dec. 28, 2021, issued in the corresponding International Application No. PCT/KR2021/012859, 9 pages.

* cited by examiner

*Primary Examiner* — John S. Chu
(74) *Attorney, Agent, or Firm* — ROTHWELL, FIGG, ERNST & MANBECK, P.C.

(57) ABSTRACT

This invention relates to a stripper composition for removing photoresist that may have excellent photoresist stripping force, inhibit corrosion of the under metal film in the stripping process, and effectively remove oxide, and a method for stripping photoresist using the same.

7 Claims, 2 Drawing Sheets

【FIG. 1】
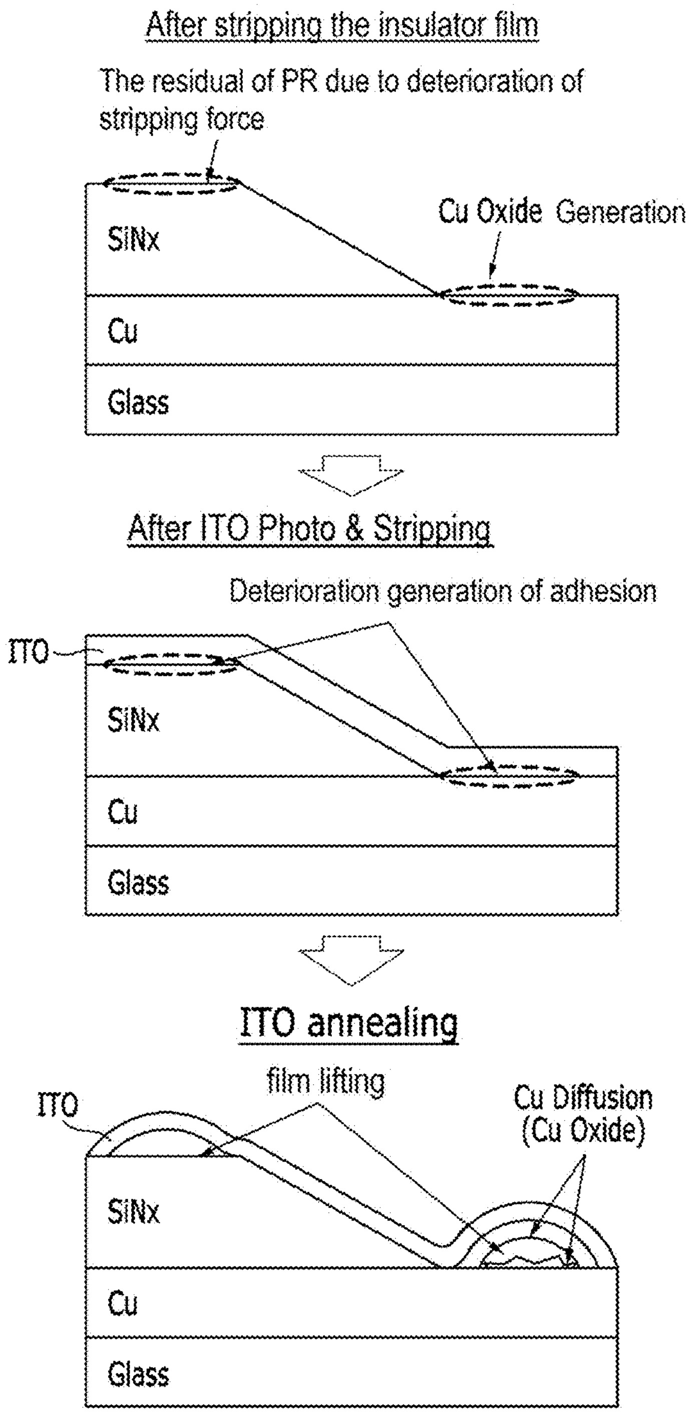

【FIG. 2】
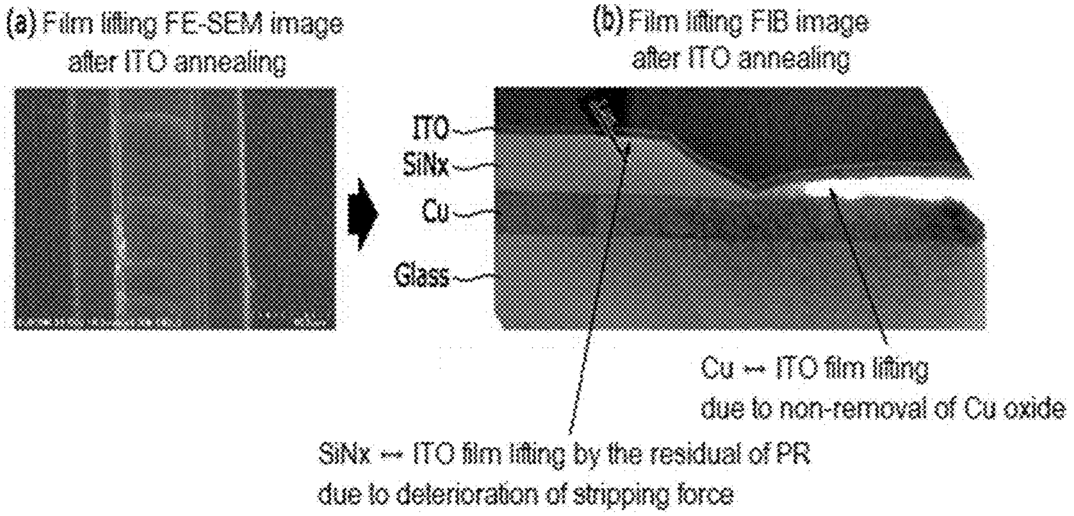

STRIPPER COMPOSITION FOR REMOVING PHOTORESIST AND STRIPPING METHOD OF PHOTORESIST USING THE SAME

CROSS-REFERENCE TO RELATED APPLICATION(S)

This application is a 35 U.S.C. 371 National Phase Entry Application from PCT/KR2021/012859 filed on Sep. 17, 2021, which claims the benefit of Korean Patent Application No. 10-2020-0122249 filed on Sep. 22, 2020 and Korean Patent Application No. 10-2021-0124895 filed on Sep. 17, 2021 with the Korean Intellectual Property Office, the disclosures of which are herein incorporated by reference in their entirety.

This invention relates to a stripper composition for removing photoresist and a method for stripping photoresist using the same. More specifically, this invention relates to a stripper composition for removing photoresist that has excellent photoresist stripping force, and yet, inhibits corrosion of under metal film in the stripping process, and can effectively remove oxide, and a method for stripping photoresist using the same.

BACKGROUND OF THE INVENTION

The microcircuit process of liquid crystal display devices or semiconductor integrated circuit fabrication process comprises forming under films, such as conductive metal films such as aluminum, aluminum alloy, copper, copper alloy, molybdenum, molybdenum alloy, and the like, or insulator films such as silicon oxide film, silicon nitride film, acryl insulator film, and the like, uniformly coating photoresist on the under film, and optionally, exposing and developing to form a photoresist pattern, and then, patterning the under film using the pattern as a mask. After the patterning process, photoresist remaining on the under film is removed, and for this purpose, a stripper composition for removing photoresist is used.

Previously, stripper compositions comprising amine compounds, protic polar solvents and aprotic polar solvents, and the like have been widely known and mainly used. Such stripper compositions are known to exhibit photoresist removal and stripping forces to some degree.

Meanwhile, with the increase in high resolution display models, Cu wiring with low electric resistance is used as TFT metal.

For example, Cu is applied for gate, source/drain wirings in the TFT wiring, and on the upper layer, an insulator films such as SiNx, SiOx, and the like is deposited. However, as shown in FIG. 1 and FIG. 2, metal oxide (Cu oxide) is generated at the contact part between Cu and ITO after deposition of an insulator film, and ITO is not properly bonded due to the Cu oxide, and film lifting between Cu/ITO is generated when annealing ITO wiring. Namely, referring to FIG. 2, after annealing the insulator film, film lifting between Cu and ITO is generated because Cu oxide is not removed, and film lifting between SiNx and ITO is generated because PR remains due to deterioration of stripping force.

In order solve the problem, previously, a strip process, which is the final step for forming gate or source/drain wirings, is progressed twice, thus removing Cu oxide, but the process time increased and cost was generated.

And, in the case of the existing stripper composition consisting only of tertiary amine, stripping force was deteriorated and it was difficult to remove metal oxide, and in case a lot of photoresist is stripped, stripping force was deteriorated. And, in case a copper metal film is used as under film, spots and foreign substances were generated due to corrosion during the stripping process, and copper oxide could not be effectively removed.

BRIEF SUMMARY OF THE INVENTION

It is an object of the invention to provide a stripper composition for removing photoresist that has excellent photoresist stripping force, and yet, inhibits corrosion of under metal film in the stripping process, and can effectively remove oxide.

It is another object of the invention to provide a method for stripping photoresist using the above stripper composition for removing photoresist.

There is provided herein a stripper composition for removing photoresist comprising two or more kinds of amine compounds;

an aprotic solvent selected from the group consisting of amide compounds in which nitrogen is substituted with one or two C1-5 linear or branched alkyl groups, sulfone and sulfoxide compounds;

a protic solvent; and a corrosion inhibitor, wherein the amine compounds comprise a) a tertiary amine compounds; and b) one or more amine compounds selected from the group consisting of cyclic amine, primary amine and secondary amine, and the weight ratio of the a) tertiary amine compound and the b) amine compounds is 1:0.05 to 1:0.8.

There is also provided herein a method for stripping photoresist, comprising a step of stripping photoresist using the stripper composition for removing photoresist.

DETAILED DESCRIPTION OF THE INVENTION

Hereinafter, a stripper composition for removing photoresist and a method for stripping photoresist using the same according to specific embodiments of the invention will be explained in detail.

The terms used herein are only to explain specific embodiments, and are not intended to limit the invention. A singular expression includes a plural expression thereof, unless it is expressly stated or obvious from the context that such is not intended. As used herein, the terms “comprise”, “equipped” or “have”, etc. are intended to designate the existence of practiced characteristic, number, step, constructional element or combinations thereof, and they are not intended to preclude the possibility of existence or addition of one or more other characteristics, numbers, steps, constructional elements or combinations thereof.

Although various modifications can be made to the invention and the invention may have various forms, specific examples will be illustrated and explained in detail below. However, it should be understood that these are not intended to limit the invention to specific disclosure, and that the invention includes all the modifications, equivalents or replacements thereof without departing from the spirit and technical scope of the invention.

According to one embodiment of the invention, there is provided a stripper composition for removing photoresist comprising: two or more kinds of amine compounds; an aprotic solvent selected from the group consisting of amide compounds in which nitrogen is substituted with one or two C1-5 linear or branched alkyl groups, sulfone and sulfoxide compounds; a protic solvent; and a corrosion inhibitor, wherein the amine compounds comprise a) a tertiary amine compounds; and b) one or more amine compounds selected from the group consisting of cyclic amine, primary amine and secondary amine, and the weight ratio of the (a) tertiary amine compound and the b) amine compounds is 1:0.05 to 1:0.8.

The inventors progressed studies on stripper compositions for removing photoresist, and confirmed through experiments that a stripper composition for removing photoresist basically comprising the above explained tertiary amine compound, and comprising cyclic amine, primary amine, secondary amine, and the like together has excellent photoresist stripping force compared to a stripper composition consisting only of a tertiary amine compound, and yet, inhibits corrosion of under metal film in the stripping process, and can more effectively remove oxide, and completed this invention. Wherein, as used herein, primary amine or secondary amine means primary linear amine or secondary linear amine.

Specifically, with the increase in high resolution display models, copper wiring with low electric resistance is used as TFT metal, wherein the copper wiring uses molybdenum (Mo) under film as barrier metal, and by oxidation-reduction potential, corrosion of molybdenum with low oxidation-reduction potential is generated. However, when progressing a stripping process for removing photoresist, damage is generated between copper/molybdenum by stripper to cause a quality problem, and thus, there is a demand for improvement in the corrosion inhibitor for preventing the corrosion of stripper.

Thus, in the present disclosure, in order to solve film lifting defect of insulator films, there is provided a method for effectively removing copper oxide even by single stripping process of copper metal wiring (gate or source/drain wirings), thus reducing a process time and solving the cost problem.

Thus, according to this invention, by adding cyclic amine, linear amine compound, and the like, stripping force may be improved, and metal oxide, specifically Cu oxide may be effectively removed.

As explained above, since the stripper composition for removing photoresist of the above embodiment comprises an aprotic solvent selected from the group consisting of amide compounds in which nitrogen is substituted with one or two C1-5 linear or branched alkyl groups, sulfone and sulfoxide compounds; a protic solvent; and a corrosion inhibitor, it can maintain excellent stripping force with the passage of time. And, since the stripper composition for removing photoresist comprises a tertiary amine compound, and one or more amine compounds selected from the group consisting of cyclic amine, primary amine and secondary amine, besides the above components, stripping force may be further improved, metal oxide may be effectively removed, and corrosion of under metal film may be inhibited.

Particularly, since the stripper composition of the above embodiment comprises linear amine as well as tertiary amine in the two or more kinds of amine compounds, Cu oxide removal rate may be improved, and thus, photoresist may not remain on an insulator film after stripping the insulator film as before, metal oxide that may be generated on under metal film (for example, under Cu wiring) may be easily removed, thereby preventing film lifting between the insulator film and under metal film when forming a transparent conductive film such as ITO.

Namely, the two or more kinds of amine compounds comprising a) and b) components may give photoresist stripping force to the stripper composition for removing photoresist according to specific mixing ratio, and specifically, may perform a function for dissolving photoresist and removing the same.

The tertiary amine compound may be used to give basic stripping force. However, in the case of a stripper composition consisting only of the tertiary amine compound, stripping force may be deteriorated, and it may be difficult to remove metal oxide.

Thus, the stripper composition for removing photoresist of the above embodiment comprises two kinds of amine compounds with specific composition, wherein a tertiary amine compound is basically used, and compounds such as cyclic amine, primary, secondary amine, and the like are used together, thereby improving stripping force than before, and increasing metal oxide removal rate. Preferably, the cyclic compound may further improve stripping force. And, the primary or secondary linear amine compound may improve metal oxide (Cu oxide) removal force.

Moreover, the stripper composition of the above embodiment comprises relatively small contents of other amines (cyclic amine, primary or secondary amine) compared to the tertiary amine, and thus, removal rate of metal oxide of metal-containing under film may be improved. Wherein, if the content of the additionally used amine compounds compared to the tertiary amine is large in two or more kinds of amine compounds, the effect for removing metal oxide of metal-containing under film may be slight.

Thus, the stripper composition of the above embodiment can maximize the effect of preventing corrosion of metal-containing under film such as a copper-containing film, particularly, a copper/molybdenum metal film, when removing photoresist pattern, and compared to the previous case of using tertiary amine compound only, or the case wherein two or more kinds of amine compounds are used but the amine compounds mixing ratio as disclosed herein is not satisfied, it can more effectively inhibit corrosion of metal-containing under film.

The stripper composition for removing photoresist of the above embodiment may be removed in a DIW rinse process immediately after a stripper process, thus improving contact resistance between a metal-containing under film and a substrate, for example, contact resistance between Gate (Cu) and PXL (ITO).

And, the stripper composition for removing photoresist of the above embodiment (stripper composition) can effectively remove metal oxide generated in metal-containing under film, such as a copper/molybdenum metal film, even by single use in the stripper process.

Meanwhile, the weight ratio of the a) tertiary amine compound and b) one or more amine compounds may be 1:0.05 to 1:0.8 or 1:0.08 to 1:0.5 or 1:0.08 to 1:0.3. Wherein, if the content ratio of the b) one or more amine compounds to the a) tertiary amine compound is 0.05 or less, the effect of removing metal oxide of metal-containing under film may be slight. And, if the content ratio of the b) one or more amine compounds to the a) tertiary amine compound is 0.8 or more, corrosion of metal contacting the stripper may be generated. And, when the weight ratio of the a) tertiary amine compound and b) one or more kinds of amine compounds may be 1:0.1 to 1:0.5 or 1:0.08 to 1:0.3, metal oxide generated in metal-containing under film after deposition of an insulator film may be more effectively removed, and metal corrosion may be inhibited as much as possible.

Thus, according to one embodiment, in case a mixture of the (a) tertiary amine compound and (b) cyclic amine and primary amine is used, the ratio may be 1:0.1 to 1:0.5 or 1:0.08 to 1:0.3.

And, in case a mixture of the (a) tertiary amine compound and (b) cyclic amine and secondary amine is used, the ratio may be 1:0.1 to 1:0.5 or 1:0.08 to 1:0.3.

And, according to another embodiment, when mixing the tertiary amine compound and cyclic amine compound, the ratio may be 1:0.1 to 1:0.5 or 1:0.08 to 1:0.3, but in case the ratio is 1:0.05 to 0.18 or less, more excellent effect may be exhibited.

And, when mixing the tertiary amine compound and primary amine compound, the ratio may be 1:0.1 to 1:0.5 or 1:0.08 to 1:0.3, but in case the ratio is 1:0.05 to 0.18 or less, more excellent effect may be exhibited.

When mixing the tertiary amine compound and secondary amine compound, the ratio may be 1:0.1 to 1:0.5 or 1:0.08 to 1:0.3, but in case the ratio is 1:0.05 to 0.18 or less, more excellent effect may be exhibited.

Thus, it is important to use the a) tertiary amine compound and b) one or more kinds of amine compounds at a specific weight ratio, and by having such a compositional ratio, the stripper composition for removing photoresist may have maximized capability of preventing corrosion of under metal film. And, according to this invention, compared to the case of using the a) tertiary amine compound or b) one or more kinds of amine compounds alone, or the case wherein the weight ratio of the a) tertiary amine compound and b) one or more kinds of amine compounds as explained above is not satisfied, excellent effect of preventing corrosion of under metal film may be exhibited.

Meanwhile, the amine compounds may be included in the content of about 0.1 to 10 wt %, or 0.5 to 7 wt %, or 1 to 5 wt %, based on the total composition. By having such an amine compound content range, the stripper composition of one embodiment may exhibit excellent stripping force, and yet, reduce deterioration of economical efficiency of the process due to excessive amount of amine, and reduce generation of waste liquid, and the like. If the amine compounds are included in an excessively high content, corrosion of under film, for example, a copper-containing under film may be caused, and in order to inhibit the corrosion, use of a large quantity of corrosion inhibitors may be required. In this case, due to the large quantity of corrosion inhibitors, a significant amount of corrosion inhibitors may be adsorbed and remain on the surface of the under film, thus deteriorating electric properties of a copper-containing under film, and the like.

Specifically, if the content of the amine compounds is less than 0.1 wt % based on the total composition, the stripping force of the stripper composition for removing photoresist may decrease, and if the content is greater than 10 wt % based on the total composition, due to the inclusion of an excessive amount of amine compounds, process economy and efficiency may be deteriorated.

And, within the above amine compounds content range, the weight ratio of the a) tertiary amine compound and b) one or more kinds of amine compound may be controlled as explained above.

According to one embodiment, the amine compounds may comprise a) a tertiary amine compound and b) a secondary amine compound; a) a tertiary amine compound, and b) cyclic amine and primary amine compounds; or a) a tertiary amine compound, and b) cyclic amine and secondary amine compounds.

And, according to another embodiment, the amine compounds may comprise a tertiary amine compound and a cyclic amine compound, or comprise a tertiary amine compound and a primary amine compound, or comprise a tertiary amine compound and a secondary amine compound.

The weight ratio of the cyclic amine compound and the primary amine compound; or the weight ratio of the cyclic amine compound and the secondary amine compound may be 1:1 to 10 or 1:1 to 5 or 1:1 to 3. And, if the weight ratio of the cyclic amine and the primary amine compound is 1:1 or less, the effect of removing metal oxide of metal-containing under film may be slight. And, if the ratio is 1:10 or more, corrosion of metal contacting the stripper may be generated.

Meanwhile, the two or more kinds of amine compounds may comprise a branched amine compound with weight average molecular weight of 95 g/mol or more.

The branched amine compound with weight average molecular weight of 95 g/mol or more not only gives photoresist stripping force, but also appropriately removes natural oxide film on under film, for example, on a copper-containing film, thus further improving adhesion between the copper-containing film and the upper insulator film, for example, a silicon nitride film.

Among such branched amines, the tertiary amine compound basically used in the above embodiment may comprise one or more compounds selected from the group consisting of methyl diethanolamine (MDEA), N-butyldiethanolamine (BDEA), diethylaminoethanol (DEEA), and triethanolamine (TEA), but is not limited thereto.

The primary amine may comprise one or more compounds selected from the group consisting of (2-aminoethoxy)-1-ethanol (AEE), aminoethyl ethanol amine (AEEA), isopropanolamine (MIPA) and ethanolamine (MEA), but is not limited thereto.

The secondary amine may comprise one or more compounds selected from the group consisting of diethanolamine (DEA), triethylene tetraamine (TETA), N-methylethanloamine (N-MEA), and diethylene triamine (DETA), but is not limited thereto.

Although specific kind of the cyclic amine compound is not significantly limited, at least a cyclic amine compound having weight average molecular weight of 95 g/mol or more may be included.

The cyclic amine may further improve photoresist stripping force due to the synergistic action with the tertiary amine compound, and increase solubility of photoresist, as explained above.

Although examples of the cyclic amine compound are not significantly limited, for example, it may comprise one or more compounds selected from the group consisting of 1-imidazolidine ethanol, 4-imidazolidine ethanol, hydroxyethylpiperazine (HEP) and aminoethylpiperazine, but is not limited thereto.

And, the stripper composition for removing photoresist may comprise an amide compound in which nitrogen is substituted with one or two C1-5 linear or branched alkyl groups, and such a compound may be used as an aprotic solvent. The amide compound in which nitrogen is substituted with one or two C1-5 linear or branched alkyl groups may satisfactorily dissolve the amine compound, and make the stripper composition for removing photoresist to effectively permeate to under film, thereby improving the stripping force and rinsing force of the stripper composition.

Specifically, the amide compound in which nitrogen is substituted with one or two C1-5 linear or branched alkyl groups may comprise amide compounds in which nitrogen is substituted with one or two methyl or ethyl groups. The amide compound in which nitrogen is substituted with one or two methyl or ethyl group may have a structure of the following Chemical Formula 1.

[Chemical Formula 1]

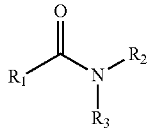

in the Chemical Formula 1, $R_1$ is hydrogen, a methyl group, an ethyl group, or a propyl group, $R_2$ is a methyl group or an ethyl group, $R_3$ is hydrogen or a C1 to 5 linear or branched alkyl group, and $R_1$ and $R_3$ may be linked with each other to form a ring.

Although examples of the C1-5 linear or branched alkyl group are not limited, for example, it may be methyl, ethyl, propyl, butyl, isobutyl, pentyl, and the like.

Although examples of the amide compound in which nitrogen is substituted with 1 or 2 methyl or ethyl groups are not significantly limited, for example, a compound of the Chemical Formula 1 wherein $R_2$ is methyl or ethyl, and $R_1$ and $R_3$ are each independently hydrogen, may be used.

For example, as the amide compound in which nitrogen is substituted with 1 or 2 C1-5 linear or branched alkyl groups, N,N-diethylformamide, N,N-dimethylacetamide, N-methylformamide, 1-methyl-2-pyrrolidinone, N-formylethylamine, or a mixture thereof may be mentioned.

And, commonly, a compound with high boiling point has low vapor pressure, and such an amide solvent may be used in the stripper composition to exert influence on the amount of stripper used on the spot. Thus, it is more preferable that an amide compound having a boiling point of 190 to 215° C. is used.

According to one embodiment, the amide compound comprises N-methylformamide or 1-methyl-2-pyrrolidinone. Namely, since a stripper process is progressed at 50° C., the amount of stripper volatilized should be small, and the amide compound has higher boiling point and lower vapor pressure than amide compounds such as N,N-diethylformamide, and thus, volatilized amount is small when using stripper. Thus, without increasing the amount, stripping property may be effectively exhibited.

And, although examples of sulfone used as the aprotic solvent are not significantly limited, for example, sulfolane may be used. And, although examples of the sulfoxide are not significantly limited, for example, dimethylsulfoxide (DMSO), diethylsulfoxide, dipropylsulfoxide, and the like may be used.

The aprotic solvent may be included in the content of 10 to 80 wt %, 20 to 70 wt %, or 30 to 60 wt % or 35 to 55 wt %, based on the total composition. By satisfying the above content range, the stripper composition for removing photoresist may secure excellent stripping force, and maintain the stripping force and rinsing force for a long time with the passage of time.

And, the stripper composition for removing photoresist may comprise a protic solvent. The protic solvent is a polar organic solvent, and allows the stripper composition for removing photoresist to permeate to under film better, thereby contributing to excellent stripping force of the stripper composition for removing photoresist, and it may effectively remove spots on under film such as a copper-containing film, thereby improving rinsing force of the stripper composition for removing photoresist.

The protic solvent may comprise alkyleneglycol monoalkylether. More specifically, the alkyleneglycol monoalkylether may comprise diethyleneglycol monomethylether, ethyleneglycol monoethylether, ethyleneglycol monobutylether, propyleneglycol monomethylether, propyleneglycol monoethylether, propyleneglycol monobutylether, diethyleneglycol monoethylether, diethyleneglycol monopropylether, diethyleneglycol monobutylether, dipropyleneglycol monomethylether, dipropyleneglycol monoethylether, dipropyleneglycol monopropylether, dipropyleneglycol monobutylether, triethyleneglycol monomethylether, triethyleneglycol monoethylether, triethyleneglycol monopropylether, triethyleneglycol monobutylether, tripropyleneglycol monomethylether, tripropyleneglycolmonoethylether, tripropyleneglycol monopropylether, tripropyleneglycol monobutylether or mixtures of two or more kinds thereof.

And, considering excellent wetting property and the resulting improved stripping force and rinsing force of the stripper composition for removing photoresist, as the alkyleneglycol monoalkylether, diethyleneglycol monomethylether (MDG), diethyleneglycol monoethylether (EDG) or diethyleneglycol monobutylether (BDG), and the like may be used.

And, the protic solvent may be included in the content of 10 to 80 wt %, or 25 to 70 wt %, or 30 to 60 wt %, based on the total composition. By satisfying the above content range, the stripper composition for removing photoresist may secure excellent stripping force, and maintain the stripping force and rinsing force for a long time with the passage of time.

Meanwhile, the stripper composition for removing photoresist may comprise a corrosion inhibitor. The corrosion inhibitor may inhibit corrosion of metal-containing under film such as a copper-containing film, when removing a photoresist pattern using the stripper composition for removing photoresist.

The corrosion inhibitor may comprise one or more selected from the group consisting of triazole-based compounds, benzimidazole-based compounds and tetrazole-based compounds.

Wherein, although examples of the triazole-based compound are not significantly limited, for example, it may be one or more selected from the group consisting of 2,21[(methyl-1H-benzotriazole-1-yl)methyl]imino]bisethanol and 4,5,6,7-tetrahydro-1H-benzotriazole, and specifically, it may be 2,21[(methyl-1H-benzotriazole-1-yl)methyl]imino]bisethanol.

The corrosion inhibitor may be included in the content of 0.01 to 10 wt %, or 0.02 to 5.0 wt %, or 0.03 to 1.0 wt %, based on the total composition. If the content of the corrosion inhibitor is less than 0.01 wt % based on the total composition, it may be difficult to effectively inhibit corrosion of under film. And, if the content of the corrosion inhibitor is greater than 10 wt % based on the total composition, a significant amount of the corrosion inhibitor may be adsorbed and remain on the under film, thus deteriorating electric properties of copper-containing under film, particularly a copper/molybdenum metal film.

Thus, according to one embodiment, the stripper composition for removing photoresist may comprise 0.1 to 10 wt % of two or more kinds of amine compounds; 10 to 80 wt % of an aprotic solvent selected from the group consisting of amide compounds in which nitrogen is substituted with one or two C1-5 linear or branched alkyl groups, sulfone and sulfoxide compounds; 10 to 80 wt % of a protic solvent; and 0.01 to 10 wt % of a corrosion inhibitor.

Meanwhile, the stripper composition for removing photoresist may further comprise silicon-based nonionic surfactant. The silicon-based nonionic surfactant may be stably maintained without chemical change, denaturation or decomposition even in a strongly basic stripper composition comprising an amine compound, and the like, and exhibit excellent compatibility with the above explained aprotic polar solvents or protic organic solvents. Thus, the silicon-based nonionic surfactant may be mixed well with other components to lower surface tension of the stripper composition, and allows the stripper composition to exhibit more excellent wetting property for photoresist to be removed, and under film. As the result, the stripper composition of one embodiment comprising the same may not only exhibit more excellent photoresist stripping force, but also exhibit excellent under film rinsing force, and thus, even after treatment with the stripper composition, spots and foreign substances may be effectively removed without generating and remaining spots or foreign substances on the under film.

Moreover, the silicon-based nonionic surfactant may exhibit the above explained effects even in a very low content, and thus, generation of by-products due to denaturation or decomposition thereof may be minimized.

Specifically, the silicon-based nonionic surfactant may comprise polysiloxane-based polymer. More specifically, although examples of the polysiloxane-based polymer are not significantly limited, for example, polyether modified acryl functional polydimethylsiloxane, polyether modified siloxane, polyether modified polydimethylsiloxane, polyethylalkylsiloxane, aralkyl modified polymethylalkylsiloxane, polyether modified hydroxy functional polydimethylsiloxane, polyether modified dimethylpolysiloxane, modified acryl functional polydimethylsiloxane, or mixtures of two or more kinds thereof may be used.

The silicon-based nonionic surfactant may be included in the content of 0.0005 wt % to 0.1 wt %, or 0.001 wt % to 0.09 wt %, or 0.001 wt % to 0.01 wt %, based on the total composition. If the content of the silicon-based nonionic surfactant is less than 0.0005 wt % based on the total composition, the effect of improvement in stripping force and rinsing force of the stripper composition according to the addition of the surfactant may not be sufficiently achieved. And, if the content of the silicon-based nonionic surfactant is greater than 0.1 wt % based on the total composition, when progressing a stripping process using the stripper composition, bubbles may be generated at high pressure to generate spots on the under film, or cause malfunction of equipment sensor.

The stripper composition for removing photoresist may further comprise common additives as necessary, and specific kind or content of the additives are not specifically limited.

And, the stripper composition for removing photoresist may be prepared by a common method of mixing the above explained components, and the preparation method of the stripper composition for removing photoresist is not specifically limited.

By the above-explained stripper composition for removing photoresist according to one embodiment, copper oxide removal force of a cleaned substrate surface, measured by the following Formula 1 using XPS(X-ray photoelectron spectroscopy), after cleaning the substrate on which copper is deposited with the photoresist stripper composition, may become 0.35 or less or 0.3 or less or 0.25 or less or 0.1 to 0.23.

Cu Oxide removal force=Quantified number of XPS narrow scan O(Oxygen) after stripping a substrate with photoresist/Quantified number of XPS narrow scan Cu(copper) after stripping a substrate with photoresist [Formula 1]

In the Formula 1, the smaller the O/Cu, more excellent the Cu oxide removal rate, and thus, more excellent copper oxide removal force may be exhibited according to this invention.

The substrate may be a glass substrate with a size of 5 cm×5 cm, on which copper is deposited.

The cleaned substrate may be provided by dipping the copper-deposited substrate at 50° C. for 60 seconds using the stripper composition, and cleaning it with tertiary distilled water for 30 seconds, and then, drying it with air gun.

And, the composition for removing photoresist not only has excellent copper oxide removal force, but also has excellent photoresist stripping force, and prevents corrosion of Cu/Mo metal under film, and thus, can provide displays having excellent performances.

Meanwhile, according to another embodiment of the invention, there is provided a method for stripping photoresist, comprising a step of stripping photoresist using the stripper composition for removing photoresist of one embodiment.

The photoresist stripping method of one embodiment may comprise steps of: forming a photoresist pattern on a substrate having under film; patterning the under film with the photoresist pattern; and stripping the photoresist using the stripper composition for removing photoresist.

To the stripper composition for removing photoresist, details explained with regard to the above embodiment are applied.

Specifically, the photoresist stripping method may comprise forming a photoresist pattern on a substrate having under film through a photolithography process, and then, patterning the under film using the photoresist pattern as a mask, and stripping the photoresist using the above explained stripper composition.

In the photoresist stripping method, the step of forming a photoresist pattern and the step of patterning the under film may be conducted by common device manufacturing process, and are not specifically limited.

Meanwhile, although examples of the step of stripping photoresist using the stripper composition for removing photoresist are not significantly limited, for example, a method of treating a substrate where a photoresist pattern remains with the stripper composition for removing photoresist, cleaning it with an alkali buffer solution, cleaning it with ultra pure water, and drying, may be used. Since the stripper composition exhibits excellent stripping force, rinsing force of effectively removing spots on the under film, and natural oxide film removal capability, it can effectively remove a photoresist pattern remaining on the under film, and maintain good surface state of the under film. Thus, on the patterned under film, subsequent processes may be appropriately progressed to form devices.

Although examples of the under film are not specifically limited, it may comprise aluminum or aluminum alloy, copper or copper alloy, molybdenum or molybdenum alloy, or mixtures thereof, composite alloys thereof, composite laminates thereof, and the like.

The kind, component or properties of photoresist to be stripped are not specifically limited, and for example, it may be photoresist known to be used for under films comprising aluminum or aluminum alloy, copper or copper alloy, molybdenum or molybdenum alloy, and the like. More specifically, the photoresist may comprise photosensitive resin components such as novolac resin, resol resin, or epoxy resin, and the like.

Advantageous Effects

According to this invention, there are provided a stripper composition for removing photoresist that has excellent photoresist stripping force, and yet, inhibits corrosion of under metal film in the stripping process, and particularly, effectively removes metal oxide (Cu oxide) generated at the contacting part of Cu and ITO after deposition of an insulator film, thus solving film lifting defect, and a method for stripping photoresist using the same.

BRIEF DESCRIPTION OF THE DRAWINGS

FIG. 1 is a schematic diagram for explaining film lifting in an insulator film, after stripping and annealing in the previous display manufacturing process.

FIG. 2 shows (a) FE-SEM image and (b) FIB image regarding film lifting after annealing of an insulator film.

Hereinafter, the invention will be explained in more detail in the following Examples. However, these examples are presented only as illustrations of the invention, and the invention is not limited thereby.

Example and Reference Example: Preparation of Stripper Composition for Removing Photoresist According to the compositions of the following Table 1, components were mixed to prepare each stripper composition for removing photoresist of Examples and Reference Examples. Specific compositions of the prepared stripper compositions for removing photoresist are as described in the following Tables 1 and 2.

Specifically, the components described in the following Tables 1 and 2 were mixed in a 500 ml beaker to prepare 300 g of a mixture. It was stirred and heated on a hot plate to prepare liquid chemical (stripper composition) under 50° C. temperature condition.

TABLE 1

| | | Example | | | | | | | | |
|---|---|---|---|---|---|---|---|---|---|---|
| | | 1 | 2 | 3 | 4 | 5 | 6 | 7 | 8 | 9 |
| tertiary | MDEA | 3 | | | 3 | | | 3 | | |
| amine | TEA | | 3 | | | 3 | | | 3 | |
| | BDEA | | | 3 | | | 3 | | | 3 |
| cyclic | IDE | 0.5 | | | 0.5 | | | 0.5 | | |
| amine | HEP | | 0.5 | | | 0.5 | | | 0.5 | |
| | AEP | | | 0.5 | | | 0.5 | | | 0.5 |
| primary | AEEA | 0.5 | | | 0.5 | | | 0.5 | | |
| amine | AEE | | 0.5 | | | 0.5 | | | 0.5 | |
| secondary amine | N-MEA | | | 0.5 | | | 0.5 | | | 0.5 |
| Aprotic | NMF | 55.00 | 55.00 | 55.00 | | | | 50.00 | 50.00 | 50.00 |
| solvent | NMP | | | | 55.00 | 55.00 | 55.00 | 5.00 | 5.00 | 5.00 |
| Protic | EDG | | | 40.70 | | | 40.70 | | | 40.70 |
| solvent | MDG | | 40.70 | | | 40.70 | | | 40.70 | |
| | BDG | 40.70 | | | 40.70 | | | 40.70 | | |
| Corrosion inhibitor | | 0.30 | 0.30 | 0.30 | 0.30 | 0.30 | 0.30 | 0.30 | 0.30 | 0.30 |

TABLE 2

| | | Reference Example | | | | | |
|---|---|---|---|---|---|---|---|
| | | 1 | 2 | 3 | 4 | 5 | 6 |
| tertiary | MDEA | 3 | | | 3 | | |
| amine | TEA | | 3 | | | 3 | |
| | BDEA | | | 3 | | | 3 |
| cyclic | IDE | 0.5 | | | | | |
| amine | HEP | | 0.5 | | | | |
| | AEP | | | 0.5 | | | |
| primary | AEEA | | | | 0.5 | | |
| amine | AEE | | | | | 0.5 | |
| secondary amine | N-MEA | | | | | | 0.5 |
| Aprotic | NMF | 55.00 | 55.00 | 55.00 | 55.00 | 55.00 | 55.00 |
| solvent | NMP | | | | | | |
| Protic | EDG | | | 41.20 | | | 41.20 |
| solvent | MDG | | 41.20 | | | 41.20 | |
| | BDG | 41.20 | | | 41.20 | | |
| Corrosion inhibitor | | 0.30 | 0.30 | 0.30 | 0.30 | 0.30 | 0.30 |

MDEA: N-methyldiethanolamine (CAS: 150-59-9)
TEA: triethanolamine (CAS: 102-71-6)
BDEA: N-butyldiethanolamine (CAS: 102-79-4)
IDE: 1-imidazolidine ethanol (CAS: 77215-47-5)
HEP: hrdoxyethyl-piperazine (CAS: 103-76-4)
AEP: N-aminoethylpiperazine (CAS: 140-31-8)
AEEA: aminoethylethanolamine (CAS: 111-41-1)
AEE: 2-(2-amino ethoxy) ethanol (CAS: 929-06-6)
N-MEA: N-methylethanolamine (CAS: 109-83-1)
NMF: N-methylformamide (CAS: 123-39-7)
NMP: N-methyl-2-pyrrolidone (CAS: 872-50-4)
EDG: ethyl digylcol (CAS: 111-90-0)
MDG: methyl digylcol (CAS: 111-77-3)
BDG: diethyleneglycol monobutylether (CAS: 112-34-5)
corrosion inhibitor:
2,21[(methyl-1H-benzotriazole-1-yl)methyl]imino]bisethanol(2,21[(Methyl-1H-benzotriazol-1-yl)methyl]imino] bisethanol, CAS: 88477-37-6), (DEATTA, IR-42)

Comparative Examples 1 to 15: Preparation of Stripper Composition for Removing Photoresist According to the compositions of the following Tables 3 and 4, components were mixed to prepare each stripper composition for removing photoresist of Comparative Examples. Specific compositions of the prepared stripper compositions for removing photoresist are as described in the following Tables 3 and 4.

Specifically, the components as described in the following Tables 3 and 4 were mixed in a 500 ml beaker to prepare 300 g of a mixture. It was stirred and heated in a hot plate to prepare liquid chemical (stripper composition) under 50° C. temperature condition.

TABLE 3

| | | Comparative Example | | | | | | | | |
|---|---|---|---|---|---|---|---|---|---|---|
| | | 1 | 2 | 3 | 4 | 5 | 6 | 7 | 8 | 9 |
| tertiary amine | MDEA | 3.5 | | | | | | | | |
| | TEA | | 3.5 | | | | | | | |
| | BDEA | | | 3.5 | | | | | | |
| cyclic amine | IDE | | | | 3.5 | | | | | |
| | HEP | | | | | 3.5 | | | | |
| | AEP | | | | | | 3.5 | | | |
| primary amine | AEEA | | | | | | | 3.5 | | |
| | AEE | | | | | | | | 3.5 | |
| secondary amine | N-MEA | | | | | | | | | 3.5 |
| Aprotic solvent | NMF | 55.00 | 55.00 | 55.00 | 55.00 | 55.00 | 55.00 | 55.00 | 55.00 | 55.00 |
| | NMP | | | | | | | | | |
| Protic solvent | EDG | | | 41.20 | | | 41.20 | | | 41.20 |
| | MDG | | 41.20 | | | 41.20 | | | 41.20 | |
| | BDG | 41.20 | | | 41.20 | | | 41.20 | | |
| Corrosion inhibitor | | 0.30 | 0.30 | 0.30 | 0.30 | 0.30 | 0.30 | 0.30 | 0.30 | 0.30 |

TABLE 4

| | | Comparative Example | | | | | |
|---|---|---|---|---|---|---|---|
| | | 10 | 11 | 12 | 13 | 14 | 15 |
| Tertiary amine | MDEA | 3 | | 3 | 3 | 5 | 3 |
| | TEA | | 3 | | | | |
| | BDEA | | | | | | |
| cyclic amine | IDE | | | 0.5 | 3 | | |
| | HEP | | 0.05 | | | | |
| | AEP | | | | | | |
| primary amine | AEEA | | | | | | |
| | AEE | | | 5.5 | | 1 | 1 |
| secondary amine | N-MEA | 3 | 0.04 | | | | |
| Aprotic solvent | NMF | 55.00 | | 55.00 | 55.00 | | |
| | NMP | | 55.00 | | | 33.99 | 35.98 |
| Protic solvent | EDG | | | | | 50 | 30 |
| | MDG | | | 35.7 | | | |
| | BDG | 43.7 | 41.20 | | 43.7 | | |
| Corrosion inhibitor | | 0.3 | 0.30 | 0.30 | 0.30 | | 0.01 |
| MTBT | | | | | | 0.01 | 0.01 |
| HMDM | | | | | | 10 | |
| Deionized water | | | | | | | 30 |

MDEA: N-methyldiethanolamine (CAS: 150-59-9)

TEA: triethanolamine (CAS: 102-71-6)

BDEA: N-butyldiethanolamine (CAS: 102-79-4)

IDE: 1-imidazolidine ethanol (CAS: 77215-47-5)

HEP: hydroxyethyl-piperazine (CAS: 103-76-4)

AEP: N-aminoethylpiperazine (CAS: 140-31-8)

AEEA: aminoethylethanolamine (CAS: 111-41-1)

AEE: 2-(2-amino ethoxy) ethanol (CAS: 929-06-6)

N-MEA: N-methylethanolamine (CAS: 109-83-1)

NMF: N-methylformamide (CAS: 123-39-7)

NMP: N-methyl-2-pyrrolidone (CAS: 872-50-4)

EDG: ethyl diglycol (CAS: 111-90-0)

MDG: methyldiglycol (CAS: 111-77-3)

BDG: diethyleneglycol monobutylether (CAS: 112-34-5)

corrosion inhibitor: 2,21[(methyl-1H-benzotriazol-1-yl)methyl]imino]bisethanol, CAS: 88477-37-6), (DE-ATTA, IR-42)

MTBT: 4-methyl-4,5,6,7-tetrahydro-1H-benzo[1,2,3]triazole

HMDM: 4-hydroxymethyl-2,2-dimethyl-1,3-dioxolane

Experimental Example: Measurement of Properties of Stripper Compositions for Removing Photoresist Obtained Examples and Comparative Examples The properties of the stripper compositions obtained in Examples and Comparative Examples were measured as follows, and the results were shown in Tables.

1. Evaluation of Stripping Force (1) Preparation of Substrate for Evaluation

First, on a 100 mm×100 mm glass substrate on which a copper-containing thin film was formed, 3.5 mℓ of a photoresist composition (product name: JC-800) was dropped, and the photoresist composition was coated at 400 rpm for 10 seconds in a spin coater. The glass substrate was mounted on a hot plate, and hard-baked under very serious conditions of temperature of 170° C. for 20 minutes to form photoresist. The glass substrate on which the photoresist was formed was air cooled at room temperature, and then, cut to a size of 50 mm×50 mm, thus preparing a sample for the evaluation of stripping force.

(2) Evaluation of Stripping 300 g of each stripper composition obtained in Examples and Comparative Examples was prepared, and while raising the temperature to 50° C., the above prepared substrate was dipped with the stripper composition for 60 to 600 seconds.

After the dipping, the substrate was taken out and cleaned with tertiary distilled water for 30 seconds, which process was repeated three times, and dried with air gun.

Using an optical microscope, a time when the residual photoresist disappeared in the cleaned sample was confirmed to evaluate stripping force (unit: sec).

The stripping force of each stripper composition of Examples and Comparative Examples was evaluated as explained above, and the results were shown in the following Tables 5 to 7.

TABLE 5

| | Example | | | | | | | | | Reference Example | | | | | |
|---|---|---|---|---|---|---|---|---|---|---|---|---|---|---|---|
| | 1 | 2 | 3 | 4 | 5 | 6 | 7 | 8 | 9 | 1 | 2 | 3 | 4 | 5 | 6 |
| Stripping time (sec) | 240 | 240 | 240 | 240 | 240 | 240 | 240 | 240 | 240 | 240 | 240 | 240 | 300 | 300 | 300 |

TABLE 6

| | Comparative Example | | | | | | | | |
|---|---|---|---|---|---|---|---|---|---|
| | 1 | 2 | 3 | 4 | 5 | 6 | 7 | 8 | 9 |
| Strip-ping time (sec) | 420 | 420 | 420 | 240 | 240 | 240 | 300 | 300 | 300 |

TABLE 7

| | Comparative Example | | | | |
|---|---|---|---|---|---|
| | 10 | 11 | 12 | 14 | 15 |
| Striping time (sec) | 300 | 360 | 240 | 360 | 420 |

As shown in the Tables 5 to 7, it was confirmed that the stripper compositions of Examples comprising two or more kinds of amine compounds with specific combinations and ratios exhibit stripping forces equivalent to or more excellent than those of stripper compositions of Comparative Examples and Reference Examples.

Namely, it was confirmed that in Examples 1 to 9 and Reference Examples 1 to 3, since a tertiary amine is basically included, and a cyclic amine is included together, or a cyclic amine and a primary or a secondary linear amine are included together, stripping forces were improved compared to Comparative Examples. And, in Reference Examples 4 to 6, a small amount of a primary linear amine or secondary linear amine was included together with a tertiary amine, thus exhibiting stripping forces equivalent to those of Comparative Examples.

However, although the results of Reference Examples 1 to 6 were better than the results of Comparative Examples, striping forces were inferior compared to Examples 1 to 9. Namely, even if a tertiary amine and other kinds of amines are included, unless the specific combination and ratio of amines as disclosed herein are satisfied, stripping force of the photoresist composition cannot be improved.

On the other hand, Examples 1 to 9 generally exhibit stripping forces equivalent to or more excellent than those of Comparative Examples and Reference Examples.

2. Evaluation of Cu Oxide Removal (1) Preparation of Substrate for Evaluation

A glass substrate on which copper (no pattern) was deposited was prepared with a size of 5 cm×5 cm.

(2) Evaluation of Copper Oxide Removal 300 g of each stripper composition obtained in Examples and Comparative Examples was prepared, and while raising the temperature to 50° C., the above prepared substrate was dipped with the stripper composition for 60 seconds.

After the dipping, the substrate was taken out and cleaned with tertiary distilled water for 30 seconds, and then, dried with air gun.

Using XPS(X-ray photoelectron spectroscopy), copper oxide removal force on the copper surface of the cleaned sample was evaluated.

Specifically, C, Cu, O were XPS narrow scanned to quantify the elements, and then, O/Cu was calculated, and it was compared with O/Cu ratio after photoresist strip in the specimen. (The smaller the O/Cu ratio, the better the Cu oxide removal rate.)

Cu Oxide removal force=quantified number of XPS narrow scan O(Oxygen) after stripping the sample with the stripper composition for removing photoresist/quantified number of XPS narrow scan Cu(copper) after stripping the sample with the stripper composition for removing photoresist [Formula 1-1]

As explained above, copper oxide removal force of each stripper composition of Examples and Comparative Examples was evaluated, and the results were shown in the following Tables 8 to 10.

TABLE 8

| | Example | | | | | | | | | Reference Example | | | | | |
|---|---|---|---|---|---|---|---|---|---|---|---|---|---|---|---|
| | 1 | 2 | 3 | 4 | 5 | 6 | 7 | 8 | 9 | 1 | 2 | 3 | 4 | 5 | 6 |
| O/Cu Ratio | 0.23 | 0.22 | 0.23 | 0.23 | 0.23 | 0.22 | 0.23 | 0.22 | 0.23 | 0.55 | 0.56 | 0.54 | 0.35 | 0.37 | 0.34 |

TABLE 9

| | Comparative Example | | | | | | | | |
|---|---|---|---|---|---|---|---|---|---|
| | 1 | 2 | 3 | 4 | 5 | 6 | 7 | 8 | 9 |
| O/Cu Ratio | 0.61 | 0.62 | 0.61 | 0.55 | 0.56 | 0.54 | 0.41 | 0.39 | 0.40 |

TABLE 10

| | Comparative Example | | | | |
|---|---|---|---|---|---|
| | 10 | 11 | 12 | 14 | 15 |
| O/Cu Ratio | 0.42 | 0.53 | 0.40 | 0.62 | 0.64 |

As shown in the Tables 8 to 10, the stripper compositions of Examples comprising two or more kinds of amine compounds with specific combinations and ratios exhibited excellent Cu oxide removal rate, compared to the stripper compositions of Comparative Examples and Reference Examples.

Namely, in the case of Comparative Examples 1 to 9 wherein a primary, secondary or tertiary amine or a cyclic amine is included alone, Cu oxide removal rates were generally inferior to Examples. And, in the case of Comparative Examples 10 to 12 wherein a primary, secondary amine or a cyclic amine is additionally included together with a tertiary amine but the specific content ratio as disclosed herein is not satisfied, Cu oxide removal rates were inferior to Examples. And, in the case of Comparative Examples 14 to 15 wherein deionized water or oxolane compound is included, Cu oxide removal rates were inferior and metal corrosion was caused.

Particularly, it was confirmed that compared to the stripper compositions of Comparative Examples 1 to 3 wherein only a tertiary amine is included, in the case of Examples 1 to 9 wherein a tertiary amine is basically included and a cyclic and linear amine are included together, Cu oxide removal rates were further improved. And, in the case of Reference Examples 1 to 6 wherein a tertiary amine and a cyclic amine or a linear amine are included at a specific content ratio, the effects were equivalent to or better than the effects of Comparative Examples 4 to 9, but excellent compared to Comparative Examples 1 to 3. However, although Reference Examples 1 to 6 have better results than Comparative Examples, Cu oxide removal rates were inferior compared to Examples 1 to 9. That is, even if a tertiary amine and other kinds of amines are included, unless the specific combination and ratio of amines as disclosed herein are satisfied, Cu oxide removal rate cannot be improved.

On the other hand, in the case of Examples 1 to 9, compared to Reference Examples as well as to Comparative Examples, equivalent or more excellent stripping forces were generally exhibited.

Thus, it was confirmed that in the case of Examples 1 to 9 wherein a mixture of a cyclic amine and a primary or secondary amine of specific contents are included together with a tertiary amine, Cu oxide removal rate was very excellent.

Therefore, the stripper composition of Examples have excellent Cu oxide removal rate, and thus, can solve film lifting defect between Cu/ITO when annealing ITO wiring.

3. Evaluation of Corrosion of Copper (Cu)/Molybdenum (Mo) Metal Under Film (Evaluation of Cu/Mo Under-Cut Damage)

(1) Preparation of Substrate for Evaluation

A glass substrate on which copper/molybdenum pattern was formed was prepared with the size of 5 cm×5 cm.

(2) Evaluation of Corrosion of Copper/Molybdenum Metal Under Film 300 g of each stripper composition obtained Examples and Comparative Examples was prepared, and while raising the temperature to 50° C., the substrate was dipped with the stripper composition for 10 minutes.

After the dipping, the substrate was taken out and cleaned with tertiary distilled water for 30 seconds, and then, dried with air gun.

Using transmission electron microscope (Helios NanoLab650), the cross-sections of the samples for evaluating corrosion of under films, obtained in Examples, Reference Examples and Comparative Examples, were observed. Specifically, using FIB (Focused Ion Beam), thin specimens of the samples for evaluating corrosion of under film were manufactured, and then, observed at the acceleration voltage of 2 kV, and in order to prevent surface damage of the sample by ion beam during the specimen manufacturing process, TEM thin specimens were manufactured after forming a Pt (platinum) protection layer on the surface of the specimen (Cu layer). As explained above, corrosion of the stripper compositions of Examples, Reference Examples and Comparative Examples were evaluated, and the results were shown in the following Tables 11 to 13.

TABLE 11

| | Example | | | | | | | | | Reference Example | | | | | |
|---|---|---|---|---|---|---|---|---|---|---|---|---|---|---|---|
| | 1 | 2 | 3 | 4 | 5 | 6 | 7 | 8 | 9 | 1 | 2 | 3 | 4 | 5 | 6 |
| Size (nm) | <20 nm | <20 nm | <20 nm | <20 nm | <20 nm | <20 nm | <20 nm | <20 nm | <20 nm | <20 nm | <20 nm | <20 nm | <20 nm | <20 nm | <20 nm |

TABLE 12

| | Comparative Example | | | | | | | | |
|---|---|---|---|---|---|---|---|---|---|
| | 1 | 2 | 3 | 4 | 5 | 6 | 7 | 8 | 9 |
| Size(nm) | <20 nm | <20 nm | <20 nm | 280 nm | 252 nm | 182 nm | 312 nm | 151 nm | 211 nm |

TABLE 13

| | Comparative Example | | | | |
|---|---|---|---|---|---|
| | 10 | 11 | 12 | 14 | 15 |
| Size(nm) | 208 | 125 | 186 | 301 | 412 |

As shown in the Tables 11 to 13, it was confirmed that in the case of the stripper composition of Examples wherein two or more kinds of amine compounds are included with specific combinations and ratios, compared to the stripper compositions of Comparative Examples and Reference Examples, corrosion of Cu/Mo metal under film was decreased, and thus, excellent Cu/Mo under-cut damage evaluation results were confirmed.

Namely, the stripper compositions of Examples satisfying the weight ratio of a tertiary amine:one or more kinds of amine compounds in the range of 1:0.1 to 1:0.5 comprise relatively small amounts of other amines (a cyclic amine and a primary or secondary linear amine) compared to a tertiary amine, thereby preventing corrosion of Cu/Mo metal under film. And, in the case of Reference Examples, a cyclic amine, and primary or secondary amine are used at a specific ratio in smaller amounts compared to a tertiary amine, thereby improving corrosion of Cu/Mo metal under film compared to Comparative Examples.

Specifically, in the case of Examples 1 to 9 and Reference Examples 1 to 3, since a tertiary amine is basically included, and a cyclic amine is included together, or a cyclic amine and a primary or secondary linear amine are included together, stripping forces were improved. And, in the case of Reference Examples 4 to 6, since a secondary linear amine or primary linear amine is included together with a tertiary amine, stripping forces equivalent to those of Comparative Examples were exhibited.

However, although Reference Examples 1 to 6 exhibited equivalent corrosion compared to Examples 1 to 9, stripping force and Cu oxide removal rate of the photoresist composition could not be improved as explained above.

And, the stripper compositions of Comparative Examples 4 to 9 have increased contents of a primary, secondary amine or cyclic amine, and thus, Cu/Mo under-cut size increased, and corrosion was inferior. Wherein, in the case of Comparative Examples 1 to 3 wherein only a tertiary amine is included in the stripper composition, Cu/Mo under-cut size was similar to those of Examples, but stripping force and Cu oxide removal rate were inferior. And, in the case of Comparative Examples 10 to 12 wherein, a primary, secondary amine or cyclic amine is additionally included together with a tertiary amine, but the specific content ratio as disclosed herein is not satisfied, the results were inferior. And, in Comparative Examples 14 to 15 wherein deionized water or oxolane compound is included, corrosion of Cu/Mo metal under film was caused to the contrary.

From these results, it can be confirmed that the stripper compositions of Examples have very excellent capability of preventing corrosion of Cu/Mo metal under film.

The invention claimed is:

1. A stripper composition for removing photoresist comprising
   at least two amine compounds;
   an aprotic solvent selected from the group consisting of an amide compound in which nitrogen is substituted with one or two C1-5 linear or branched alkyl groups, a sulfone compound, a sulfoxide compound and a combination thereof;
   a protic solvent; and
   a corrosion inhibitor,
   wherein the at least two amine compounds comprise:
   a) a tertiary amine compound and b) a secondary amine compound;
   a) the tertiary amine compound, and b) a cyclic amine compound and a primary amine compound; or
   a) the tertiary amine compound, and b) the cyclic amine compound and the secondary amine compound,
   a weight ratio of a) and b) is 1:0.05 to 1:0.8,
   wherein the amide compound comprises N,N-diethylformamide, N,N-dimethylacetamide, N-methylformamide, 1-methyl-2-pyrrolidinone, N-formylethylamine, or a mixture thereof,
   wherein the tertiary amine compound comprises one or more compounds selected from the group consisting of methyl diethanolamine (MDEA), N-butyldiethanolamine (BDEA) diethylaminoethanol (DEEA), and triethanolamine (TEA),
   wherein the primary amine comprises one or more compounds selected from the group consisting of (2-aminoethoxy)-1-ethanol (AEE), aminoethyl ethanol amine (AEEA), isopropanolamine (MIPA) and ethanolamine (MEA),
   wherein the secondary amine comprises one or more compounds selected from the group consisting of diethanolamine (DEA), triethylene tetraamine (TETA), N-methylethanloamine (N-MEA), and diethylene triamine (DETA),
   wherein the cyclic amine comprises one or more compounds selected from the group consisting of 1-imidazolidine ethanol, 4-imidazolidine ethanol, hydroxyethylpiperazine (HEP) and aminoethylpiperazine, and
   wherein the stripper composition has copper oxide removal force of a cleaned substrate surface of 0.35 or less, and wherein the copper oxide removal force is measured by the following Formula 1 using XPS (X-ray photoelectron spectroscopy), after dipping a substrate on which copper is deposited, with the stripper composition and cleaning the substrate with distilled water:

Cu Oxide removal force=Quantified number of XPS narrow scan O (Oxygen) after stripping a substrate with the stripper composition for removing photoresist/Quantified number of XPS narrow scan Cu (copper) after stripping a substrate with the stripper composition for removing photoresist [Formula 1].

2. The stripper composition for removing photoresist according to claim 1, wherein a weight ratio of the cyclic amine compound and the primary amine compound is 1:1 to 1:10; or
   a weight ratio of the cyclic amine compound and the secondary amine compound is 1:1 to 1:10.

3. The stripper composition for removing photoresist according to claim 1, wherein the at least two amine compounds are included in the amount of 0.1 to 10 wt %, based on the total weight of the stripper composition.

4. The stripper composition for removing photoresist according to claim 1, wherein the amide compound comprises N-methylformamide or 1-methyl-2-pyrrolidinone having a boiling point of 190 to 215° C.

5. The stripper composition for removing photoresist according to claim 1, wherein the protic solvent comprises one or more selected from the group consisting of alkyleneglycol monoalkylether-based compounds.

6. The stripper composition for removing photoresist according to claim 1, wherein the composition comprises
   0.1 to 10 wt % of the at least two amine compounds;
   10 to 80 wt % of the aprotic solvent;
   10 to 80 wt % of the protic solvent; and
   0.01 to 10 wt % of the corrosion inhibitor.

7. A method for stripping a photoresist, comprising a step of applying the stripper composition for removing photoresist of claim 1 to a photoresist formed on a substrate and step for stripping the photoresist from the substrate.

* * * * *